Figure 1:
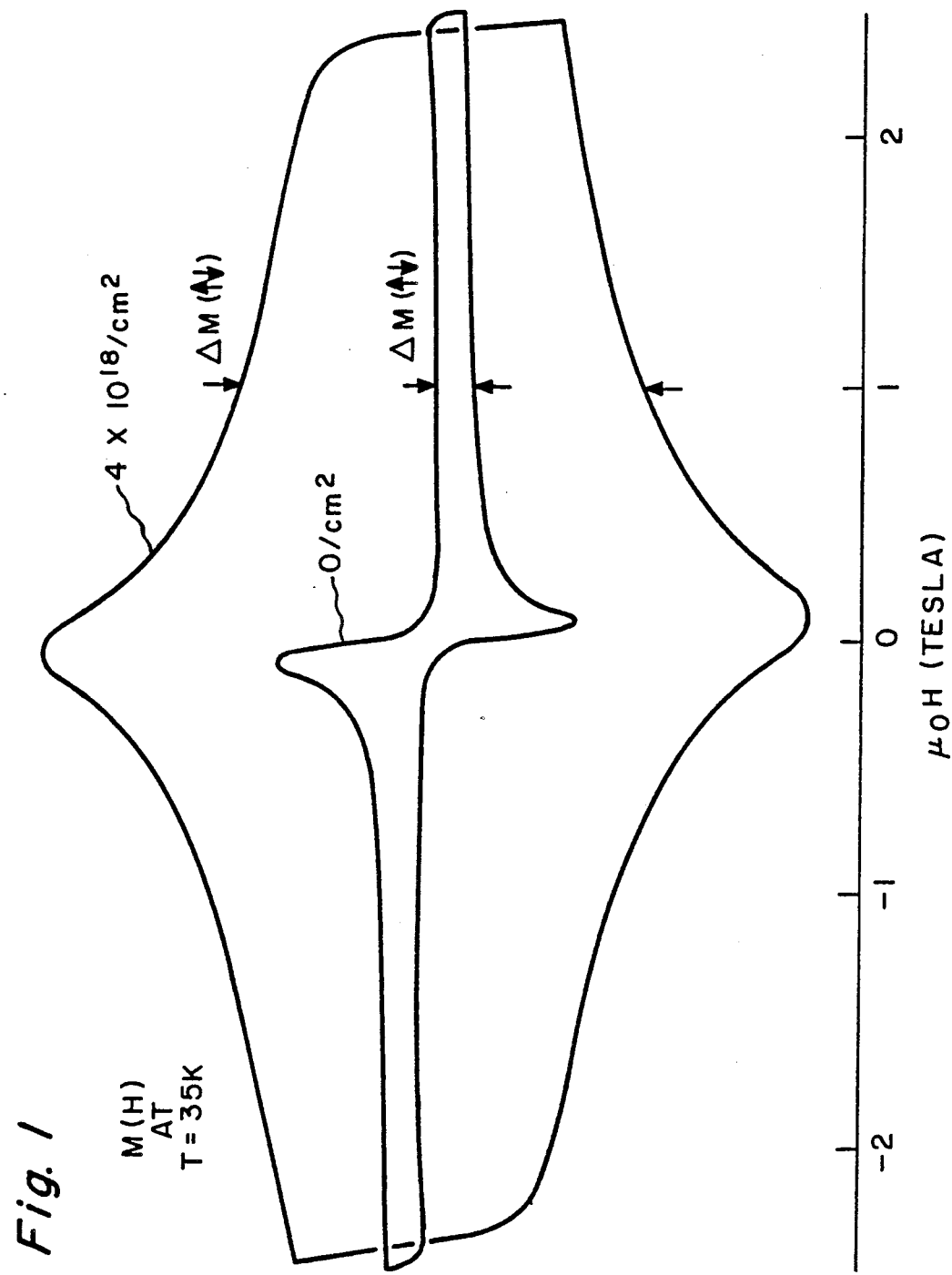

United States Patent [19]

Fleischer

[11] Patent Number: 4,996,192

[45] Date of Patent: Feb. 26, 1991

[54] Y-BA-CU-O SUPERCONDUCTOR CONTAINING RADIOACTIVE DOPANTS

[75] Inventor: Robert L. Fleischer, Schenectady, N.Y.

[73] Assignee: General Electric Company, Schenectady, N.Y.

[21] Appl. No.: 380,966

[22] Filed: Jul. 17, 1989

[51] Int. Cl.$^5$ ............................................. H01B 12/00
[52] U.S. Cl. ........................................ 505/1; 423/251; 423/260; 264/65; 264/66; 501/126; 501/152; 505/781; 505/785; 252/517
[58] Field of Search .................... 423/251, 260; 505/1, 505/781, 785; 252/517; 264/65, 66, 0.5, 22; 501/126, 152

[56] References Cited

U.S. PATENT DOCUMENTS 3,310,395 3/1967 Swartz et al.
3,346,425 10/1967 Fleischer.

OTHER PUBLICATIONS

Sherwood et al., Superconducting Properties of YBa$_2$Cu$_3$O$_{7-\delta}$ Doped with Various Metal & Oxides, 1988, Mat. Res. Soc. Symp. Proc., vol. 99, pp. 503–506.
Horowitz et al., Effect of Ambient Atmosphere on YBa$_2$Cu$_3$O$_{7-y}$, 1988, Mat. Res. Soc. Symp. Proc., vol. 99, pp. 903–906.
Togano et al., Structure and Superconducting Properties of High-T Oxide Superconductors Prepared by Liquid Quenching, MRS Int'l, Meeting on Advanced Materials, Sunshine City, Ikebukuro, Kokyo, Japan, May 30–Jun. 3-1988.
Fleischer et al., "Increased Flux Pinning Upon Thermal-Neutron Irradiation of Uranium-Doped YBaCu-3O-7", Gen. Elec. Technical Report No. 89CRD047 (Apr. 1989), 18 pp.
Swartz et al., "Effect of Fast-Neutron Irradiation of Magnetic Properties and Critical Temperature of Some Type II Superconductors", Applied Physics Letters, vol. 4 (Feb. 1964), pp. 71–73.
Bean et al., "Effect of Thermal-Neutron Irradiation on the Superconducting Properties of Nb-3Al and V-3Si Doped with Fissionable Impurities", J. Appl. Phys. 37 (1966), pp. 2218–2224.
Umezawa et al., "Enhanced Critical Magnetization Currents Due to Fast Neutron Irradiation in Single-Crystal YBa-2Cu-3O-7-$\delta$", Phys. Rev. B-36 (1987), pp. 7151–7154.
Willis et al., "Radiation Damage in YBa-2Cu-3O-7 by Fast Neutrons", MRS Meeting, Boston, (Dec. 1987), 4 pp.
Fleischer et al., "Ion Explosion Spike Mechanism for Formation of Charged-Particle Tracks in Solids", J. App. Phys. 36 (1965), pp. 3645–3652.

Primary Examiner—Brooks H. Hunt
Assistant Examiner—Ngoclan Mai
Attorney, Agent, or Firm—Jane M. Binkowski; James C. Davis, Jr.; James Magee, Jr.

[57] ABSTRACT

A polycrystalline Y-Ba-Cu-O superconductor doped with sufficient $^{235}$U and/or $^{239}$Pu atoms is irradiated with thermal neutrons to produce from about $2.5 \times 10^{14}$ to about $50 \times 10^{14}$ fission events per cubic centimeter of superconductor.

17 Claims, 3 Drawing Sheets

Y-BA-CU-O SUPERCONDUCTOR CONTAINING RADIOACTIVE DOPANTS

This invention relates to a polycrystalline Y—Ba—Cu—O superconductor material which has been doped with fissionable material and irradiated to improve its superconductive properties.

This invention is related to U.S. Pat. No. 3,310,395 to Swartz et al., assigned to the assignee hereof and incorporated herein by reference.

The discovery of ceramic superconductors with high critical temperatures has greatly improved the prospect of widespread practical application of superconductivity. Unfortunately, there are still major hurdles to be overcome before such prospects can be realized. In particular the critical-current densities of sintered, polycrystalline high-temperature superconductors are much too low, especially in useful magnetic fields at higher temperatures. It appears that the intergranular superconductive coupling in polycrystalline materials is very weak and that flux pinning within grains is low, leading to very rapid flux creep and low critical-current densities even in single grains.

The pinning of flux within bulk type-II superconductors is caused by imperfections in the lattice. For traditional practical low-temperature superconductors such as Nb—Ti or $Nb_3Sn$, such imperfections or pinning centers include dislocations, grain boundaries, and non-superconducting inclusions or voids. For the newer, high-temperature ceramic superconductors it is not clear what the naturally occurring weak pinning centers are. The traditional methods of introducing lattice defects, such as cold work and grain-boundary control through heat treatment, appear not to be useful for the ceramic materials; they are brittle and their grain boundaries are so weak that they increase the movement of flux instead of decreasing it. Another approach that has been effective in the older, low-temperature superconductors is the introduction of pinning centers by radiation damage.

In one embodiment of the present invention, fission-fragment damage is introduced by doping Y—Ba—Cu—O with natural uranium and exposing the material to thermal neutrons, inducing fission of the uranium -235 component. The special opportunity that is envisioned in inducing fission is that the fraction of dispersed, isolated point defects is minimized relative to clumps of displaced atoms and disordered material, which are expected to be more effective pinning centers. Thus, greater flux pinning should be created before the total damage begins to degrade the critical temperature seriously.

Figure 2:
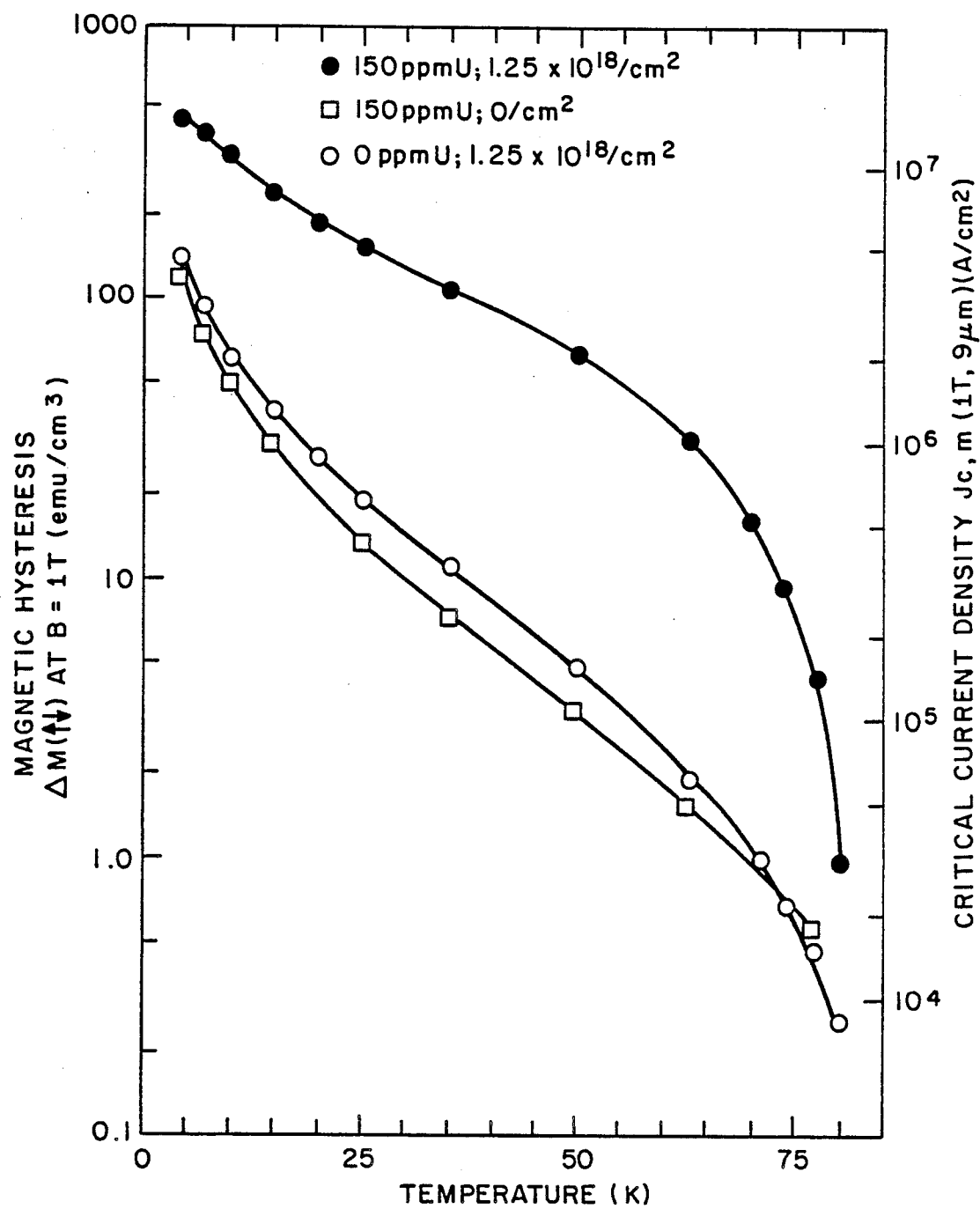
Figure 3:
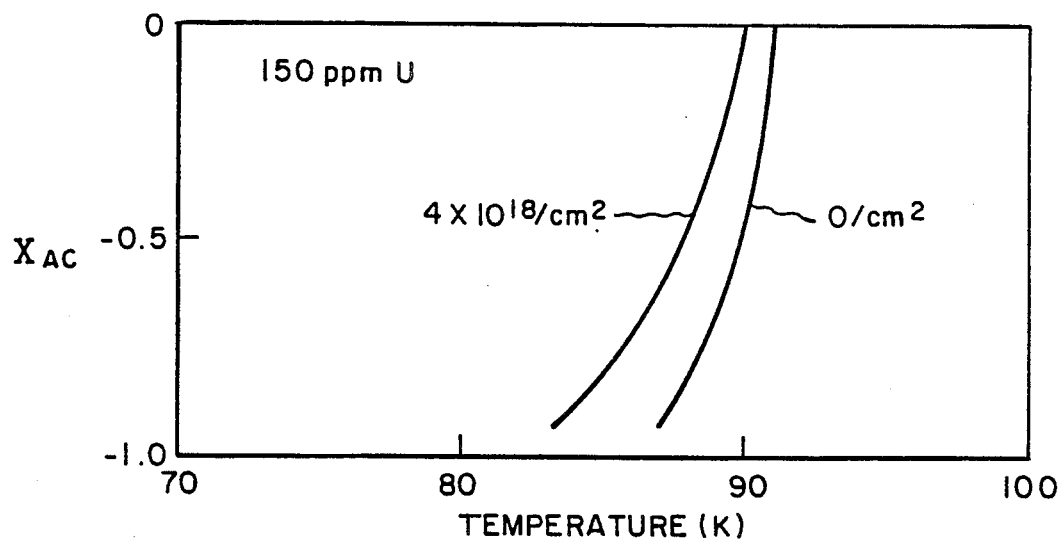
Figure 4:
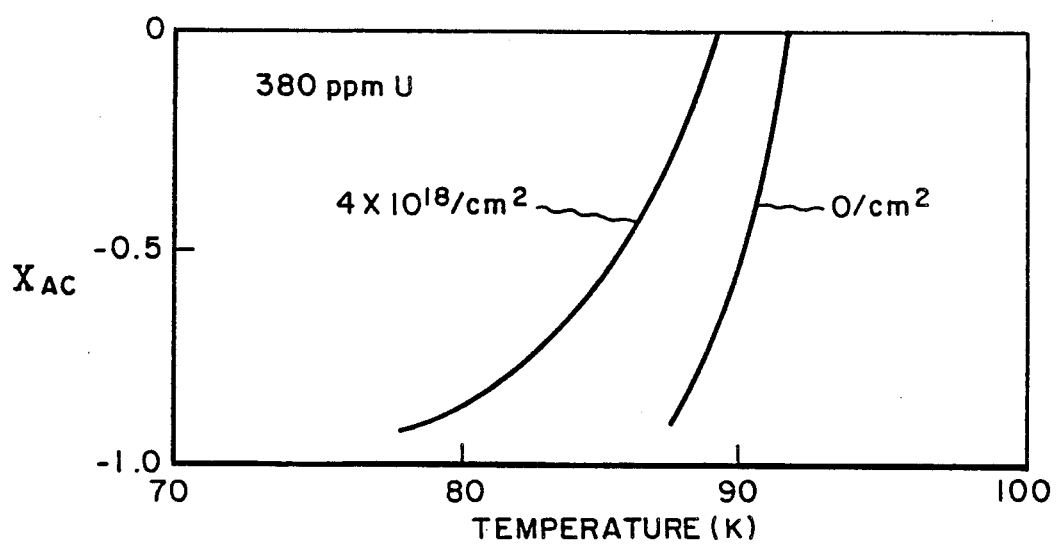

Those skilled in the art will gain a further and better understanding of the present invention from the detailed description set forth below, considered in conjunction with the figures accompanying and forming a part of the specification in which:

FIG. 1 illustrates tracings of the magnetization versus magnetic field for two natural uranium-doped (150 atomic ppm) sintered samples of Y—Ba—Cu—O exposed to zero and $1.23 \times 10^{18}$ thermal neutrons per $cm^2$, respectively. The field was cycled with a period of 1000 seconds. The magnetic hysteresis at 1 Tesla is indicated by $\Delta M$ and the associated arrows;

FIG. 2 shows the magnetic hysteresis at 1 Tesla (left-hand scale) versus temperature for unirradiated and irradiated sintered samples of Y—Ba—Cu—O (150 atomic ppm U) and a zero ppm-U, irradiated sample. The right-hand scale shows the intragranular critical-current density derived from magnetic hysteresis and grain size using the critical-state model set forth herein;

FIG. 3 shows normalized ac magnetic susceptibility versus temperature for two natural uranium-doped (150 atomic ppm U) samples of Y—Ba—Cu—O, where one of the samples had not been irradiated and where the other sample had been irradiated with thermal neutrons to a fluence of $4 \times 10^{18}/cm^2$, and FIG. 4 shows normalized ac magnetic susceptibility versus temperature for two natural uranium-doped (380 atomic ppm U) samples of Y—Ba—Cu—O, where one of the samples had not been irradiated and where the other sample had been irradiated with thermal neutrons to a fluence of $4 \times 10^{18}/cm^2$.

Briefly stated, the present process comprises providing a matrix-forming powder of oxides or precursor therefor wherein the oxide composition corresponds to the matrix composition comprised of $YBa_2Cu_3O_{7xy}$ where y ranges from zero to about 1, providing an oxide additive or precursor therefor selected from the group consisting of natural uranium dioxide, uranium-235 dioxide, plutonium -239 dioxide and mixtures thereof, all of the uranium component of said additive and all of the plutonium-239 component of said additive providing dopant atoms, said natural uranium dioxide providing dopant atoms comprised of natural uranium which includes the uranium-235 isotope, forming a mixture of said matrix-forming powder and said additive or precursor therefor, heating said mixture to a reaction temperature ranging from greater than about 800° C to below the melting point of said oxides to produce a reaction product comprised of said matrix composition and said dopant atoms wherein said dopant atoms being substituted in said matrix composition in an amount ranging to their solubility limit therein, said precursors decomposing below said reaction temperature producing said oxides, comminuting said reaction product to produce a sinterable powder, forming said sinterable powder into a compact, sintering said compact in an oxidizing atmosphere at a temperature ranging from about 900° C. to below the melting point of said sinterable powder producing a sintered polycrystalline body having an open porosity ranging from zero to about 20% by volume of said body, cooling said body in an oxidizing atmosphere at a rate which produces a superconductive body and irradiating said superconductive body with thermal neutrons causing a sufficient number of said uranium-235 and/or plutonium-239 dopant atoms to undergo fission to produce from about $2.5 \times 10^{14}$ to about $50 \times 10^{14}$ fission events per cubic centimeter of the resulting irradiated superconductive body, said uranium-235 and/or plutonium-239 dopant atoms being present in an amount sufficient to produce said fission events.

In the present process, there is no loss, or no significant loss, of dopant atoms prior to irradiation of the superconductive body. Therefore, the number of dopant atoms in the mixture comprised of the matrix-forming powder and additive is the same as, or not significantly different from, the number of dopant atoms in the resulting sinterable powder, or in the resulting sintered body, prior to irradiation.

Generally, in carrying out the present process, yttrium oxide, barium carbonate, and copper oxide are used to provide the matrix-forming powder. They are formulated to have a metal oxide composition which corresponds to the composition $YBa_2Cu_3O_{7-y}$, wherein y ranges from zero to about 1, frequently from zero to about 0.7.

The present additive powder is an oxide, or precursor therefor, selected from the group consisting of natural uranium dioxide ($UO_2$), uranium-235 dioxide ($^{235}UO_2$), plutonium-239 dioxide ($^{239}PuO_2$) and mixtures thereof. The particular amount of additive is determined empirically. The additive should be used at least in an amount which provides sufficient uranium-235 and/or plutonium-239 dopant atoms to produce in the present process from about $2.5 \times 10^{14}$ to about $50 \times 10^{14}$ fission events per cubic centimeter of the resulting irradiated superconductive body.

Natural uranium dioxide powder, which is derived from powdered uranium ore, provides dopant atoms comprised of natural uranium which includes three natural radioactive isotopes. These are (% by weight of total natural uranium atoms) U-234 (0.006%), U-235 (0.7%) and U-238 (99%). Uranium-235 ($^{235}U$) is a readily fissionable isotope, and it is this isotope of uranium which is caused to undergo fission herein.

Generally, natural uranium dioxide powder is used in an amount ranging from about 0.04% to about 0.2% by weight of the mixture comprised of the matrix-forming powder and additive. Generally, it is used in an amount which provides dopant atoms, i.e. its entire uranium component including isotopes thereof, ranging from about 150 to about 380 atomic parts, i.e. dopant atoms, per million atomic parts of the total amount of the mixture of matrix-forming powder and additive. Generally, for optimum results, the natural uranium dioxide is used in an amount which provides within about ±5% of the solubility limit of the dopant atoms in the sintered superconductive body, before irradiation thereof, which is about 200 atomic parts of dopant atoms, per million atomic parts the mixture of matrix-forming powder and additive.

Uranium-235 dioxide is preferred since it provides only U-235 dopant atoms thereby providing a larger effect, i.e. more fission events, with lesser irradiation. Generally, uranium-235 dioxide is used in an amount ranging from about 3 parts per million to about 2000 parts per million, preferably between 6 and 800 parts per million, by weight of the mixuture of matrix-forming powder and additive. Generally, the $^{235}UO_2$ powder is used in an amount which provides from about 0.6 to about 380 atomic $^{235}U$ parts per million atomic parts of the mixture of matrix-forming powder and additive. For optimum results, the $^{235}UO_2$ powder provides within about ±5% of the solubility limit of the $^{235}U$ atoms in the sintered body which is about 150 atomic $^{235}U$ parts per million atomic parts the mixture of matrix-forming powder and additive.

Generally, $^{239}PuO_2$ ranges from about 2 parts per million to about 0.15%, preferably about between about 5 and 600 parts per million, by weight of the mixture of matrix-forming powder and additive. Generally, the $^{239}PuO_2$ powder provides from about 0.4 to about 380 atomic $^{239}Pu$ parts per million atomic parts of the mixture of matrix-forming powder and additive. For optimum results, the $^{239}PuO_2$ powder provides within about ±5% of the solubility limit of $^{239}Pu$ atoms in the sintered body.

In one embodiment, the additive is comprised of a mixture formed by adding $^{235}UO_2$ to natural uranium dioxide, i.e. enriched uranium dioxide, wherein $^{235}UO_2$ comprises from about 1% to about 93% by weight of the additive, or wherein the $^{235}U$ atoms comprise from about 1% to about 93% by weight of the dopant atoms.

If desired, a particulate inorganic precursor of the reactant oxides can be used. The precursor should decompose completely to form the oxide and by-product gas or gases leaving no contaminants in the reacted mass. Barium carbonate is a useful precursor for barium oxide. The precursor should be used in an amount sufficient to produce the respective oxide in the required amount.

The oxides or precursors therefor should be of a size which allows the reaction product to be produced. Generally, these powders are used in the particle size range in which they are available commercially, which ordinarily ranges from submicron up to about 100 microns. The powders should be free of large, hard aggregates, i.e. significantly above 100 microns in size, which might survive the mixing process and prevent sufficient reactant contact for satisfactory reaction rates.

The matrix-forming powders and additive are admixed to form a mixture which preferably is uniform or substantially uniform in order to produce a reaction product which preferably is uniform or substantially uniform. Mixing of the powders can be carried out by a number of conventional techniques such as, for example, ball milling.

The mixture of matrix-forming powder and additive is reacted to produce the present reaction product. The mixture is reacted in an oxidizing atmosphere generally at a temperature ranging from greater than about 800° C. to below the melting point of the metal oxides. Frequently, reaction temperature ranges from about 850° C. to 1000° C. or from about 900° C. to 950° C. Reaction time is determined empirically. Generally, the reaction product is cooled in an oxidizing atmosphere to about room temperature. Generally, the oxidizing atmosphere, i.e. the atmosphere for carrying out the reaction as well as for cooling the reaction product, is comprised of at least about 1% by volume of oxygen and the remainder of the atmosphere is a gas which has no significant deleterious effect on the reaction product. Representative of such gases is nitrogen or a noble gas such as argon or helium. Preferably, the oxidizing atmosphere is comprised of oxygen or air. Generally, the oxidizing atmosphere is at about atmospheric pressure.

The reaction product is comprised of the matrix composition $YBa_2Cu_3O_{7-y}$, where y ranges from zero to about 1, frequently from about zero to about 0.7, and the present dopant atoms which are distributed in the matrix composition. The dopant atoms are dissolved in the matrix composition in an amount ranging to their solubility limit therein.

The reaction product is comminuted to produce the desired sinterable powder. Comminution can be carried out in a conventional manner such as, for example, by milling. Generally, the sinterable powder has an average particle radius ranging from submicron to about 10 microns, frequently from about 0.1 micron to about 5 microns, or from about 0.2 micron to about 4 microns. Average particle size can be determined by conventional techniques.

A number of conventional procedures can be used to form the sinterable powder into a compact. For example, the sinterable powder can be extruded, injection molded, die-pressed, slip cast or tape cast to produce the compact of desired shape.

Lubricants, dispersants, binders, or similar form-promoting materials, useful in producing the compact can be admixed with the sinterable powder. Such materials are well-known in the art and can be used in a conventional manner with the particular amount thereof being determined empirically. Generally, they are organic preferably of the type which evaporate or decompose on heating at relatively low temperatures, preferably below 500° C., leaving no residue or no significant residue. The form-promoting material should have no significant deleterious effect in the present process.

The compact should have a density at least sufficient to produce the present sintered body. Preferably, it has a density of at least about 45% of its theoretical density to promote densification during sintering.

Sintering of the compact is carried out in an oxidizing atmosphere which generally is about atmospheric pressure. The oxidizing atmosphere should be at least sufficiently oxidizing to produce a sintered body wherein the O, i.e. oxygen, component has a value of at least about 6.0. Generally, the sintering, i.e. firing, atmosphere contains at least about 1% by volume of oxygen and the remainder of the atmosphere should be a gas which has no significant deleterious effect on the sintered product. Representative of such gases is nitrogen or a noble gas such as argon or helium. Most preferably, the sintering atmosphere is comprised of oxygen.

Sintering is carried out at a temperature ranging from about 900° C. to below the melting temperature of the sinterable powder. Generally, sintering temperature ranges from about 900° C. to about 1000° C., and typically it ranges from about 950° C. to about 975° C. The particular sintering temperature is determined empirically and depends largely on particle size, density of the compact and final density desired in the sintered product. Generally, higher sintering temperatures produce sintered bodies of higher density and larger grain size.

Sintering time can vary and is determined empirically. Longer sintering times generally produce sintered bodies with larger grains. Generally, sintering time ranges from about two hours to eight hours.

The sintered body is cooled in an oxidizing atmosphere generally at about atmospheric pressure at a rate which produces the present superconductive body. The cooling schedule can vary and is determined empirically. Generally, the cooling oxidizing atmosphere contains at least about 20% by volume of oxygen and the remaining gas should have no significant deleterious effect on the superconductive product. Preferably, the oxidizing atmosphere is air but more preferably it is oxygen.

Specifically, during the cooling procedure, generally at a temperature ranging from about 700° C. to about 400° C., the sintered body should be cooled at a rate sufficient to produce the orthorhombic crystal structure in an amount at least sufficient to produce the superconductive body. Generally, in this temperature range of about 700° C. to about 400° C., additional oxygen is incorporated into the body. Sufficient oxygen should be incorporated in the body to permit formation of the required orthorhombic crystal structure.

Cooling of the body from about 400° C. can be at a more rapid rate, but not so fast as to fracture the body by thermal shock. The body is usually cooled to room temperature, i.e. from about 15° C. to about 30° C. The present process has no significant effect on the amounts of the other, i.e. non-oxygen, components of the body.

The sintered body and the resulting superconductive body have the same density or porosity. The body may have some closed porosity and generally has open porosity. Preferably, pores are small, preferably less than one micron, and sufficiently distributed in the body so that they have no significantly deleterious effect on mechanical properties. Porosity can be determined by standard metallographic techniques, such as, for example, optically examining a polished cross-section of the body.

By closed porosity, it is meant herein closed pores or voids in the sintered body, i.e. pores not open to the surface of the body and therefore not in contact with the ambient atmosphere. Generally, closed porosity ranges from 0 to about 10%, preferably it is less than about 5%, or less than about 1% by volume of the body.

By open porosity, it is meant herein pores or voids which are open to the surface of the sintered body, thereby making the interior surfaces accessible to the ambient atmosphere.

The sintered body should have sufficient surface area to permit production of the superconductive body and this is determined empirically. Specifically, the sintered body, during cooling thereof in an oxidizing atmosphere, should have at least sufficient surface area for contact with oxygen to allow production of the superconductive body. Generally, a portion of the surface area of the sintered body is provided by its open porosity. For a very thin body, open porosity may not be needed. Generally, the superconductive body has an open porosity ranging from 0 to about 20%, frequently from about 2% to about 20%, or from about 5% to about 15%, by volume of the body.

Preferably, the total porosity of the sintered body is not greater than about 20%.

Generally, the superconductive sintered body, before and after irradiation, is comprised of grains which are substantially equiaxed. Average grain size is at least about 1 micron and can range widely depending largely on the size of the sinterable powder and sintering conditions. Generally, average grain size can range from about 1 micron to about 100 microns, frequently from about 5 microns to about 15 microns.

The superconductive body contains the orthorhombic crystal structure in an amount at least sufficient to give the desired superconductivity. Generally, the presence of the orthorhombic phase can be determined by x-ray diffraction analysis, transmission electron microscopy, or polarized light microscopy. The superconductive body is polycrystalline.

Superconductivity of the sintered body, before and after irradiation, can be determined by conventional techniques. For example, it can be demonstrated by magnetic flux exclusion, the Meissner effect. Generally, the present superconductive body, before and after irradiation thereof, has a zero resistance transition temperature, i.e. a temperature below which there is no electrical resistance, greater than about 77K, preferably at least about 85K, and most preferably higher than about 90K.

In carrying out the present process, the superconductive body is irradiated with thermal neutrons to cause a sufficient number of uranium-235 dopant atoms, or plutonium-239 dopant atoms, or a mixture thereof to undergo fission to produce from about $2.5 \times 10^{14}$ to about $50 \times 10^{14}$ fission events per cubic centimeter of the body. By fission events, it is meant herein the energetic process of division of a fissionable nucleus that has absorbed a neutron into primarily two heavy nuclei, each comprising substantially half of the mass of the original fissionable nucleus, and the motion of these fission fragments until they come to rest. The fission products are known and can be identified and counted by a mass spectrometer. It is the production and motion of these fission fragments which causes radiation damage in the grains of the body resulting in a significant improvement in certain superconductive properties. Generally, the production of less than about $2.5 \times 10^{14}$ fission events per cubic centimeter of the body may not have a significant effect on its properties. The production of more than about $50 \times 10^{14}$ fission events per cubic centimeter of the body may have a significant deleterious effect thereon, such as, for example, lowering its zero resistance transition, i.e. critical, temperature substantially. Preferably, irradiation is carried out to produce from about $6 \times 10^{14}$ to about $12 \times 10^{14}$ fission events per cubic centimeter of the body.

The present irradiation of the superconductive body with thermal neutrons can be carried out in a known manner. The radiation dose should be sufficient to produce the present fission events in the body and should not have a significantly deleterious effect thereon. The particular radiation dose is calculated from the number of $^{235}U$ and/or $^{239}Pu$ dopant atoms in the body, the fission cross-sections of the $^{235}U$ and/or $^{239}Pu$, and the particular superconductive properties desired. Generally, the minimum radiation dose ranges from about $1 \times 10^{13}$ to about $1 \times 10^{17}$ thermal neutrons per square centimeter of the body. Generally, a radiation dose of at least about $1 \times 10^{13}$ thermal neutrons per square centimeter of the body is required when the dopant atoms are comprised of $^{235}U$ or $^{239}Pu$. Generally, a radiation dose of at least about $1 \times 10^{17}$ thermal neutrons per square centimeter of the body is required when the dopant atoms are comprised of natural uranium.

Generally, irradiation is carried out as close to room temperature as the neutron source that is used permits. Irradiation is carried out in an atmosphere which can be at about atmospheric pressure or a partial vacuum which has no significant deleterious effect on the superconductive body which can be determined empirically. Preferably, irradiation is carried out in an atmosphere of oxygen or an oxygen-enriched atmosphere at about atmospheric pressure or a partial vacuum if the sample has a tendency to lose oxygen.

Generally, the present process lowers the zero resistance transition temperature of the superconductive body less than 30%, preferably less than 20%, and more preferably it does not change it, or does not change it significantly.

The present process produces a superconductive polycrystalline body having a significantly higher magnetic hysteresis at a temperature at which it is superconductive above 5K. Generally, the magnetic hysteresis of the body is at least about 10%, and frequently more than 100%, higher at a temperature at which it is superconductive above 5K.

By a temperature at which the body is superconductive, it is meant herein a temperature at which it has no electrical resistance.

Also, the present process produces a polycrystalline body comprised of grains wherein the individual grains have a significantly higher critical current density at a temperature above 5K at which the body is superconductive. Generally, the intra-grain critical current density is at least about 10%, and frequently more than 100%, higher at a temperature at which the body is superconductive above 5K.

Since magnetic hysteresis is a measure of critical current density, it can be inferred that the present process produces a superconductive polycrystalline body having a significantly increased critical current density, generally at least about 10% higher, at temperatures above 5K at which the body is superconductive.

Briefly stated, the present superconductive polycrystalline body is comprised of the composition $YBa_2Cu_3O_{7-y}$, where y ranges from zero to about 0.3, and dopant atoms selected from the group consisting of natural uranium, $^{235}U$, $^{39}Pu$, and mixtures thereof, said natural uranium atoms ranging from a detectable amount to less than about 380 atomic parts per million atomic parts of said body, said $^{235}U$ atoms ranging from a detectable amount to less than about 380 atomic parts per million atomic parts of said body, said $^{239}Pu$ atoms ranging from a detectable amount to less than about 380 atomic parts per million atomic parts of said body, said dopant atoms being substituted in said composition in an amount ranging to their solubility limit therein, said body containing from about $2.5 \times 10^{14}$ to about $50 \times 10^{14}$ fission events per cubic centimeter of said body.

The present irradiated superconductive body contains at least a detectable amount of dopant atoms, i.e. an amount detectable by a mass spectrometer.

In one embodiment, the dopant atoms in the present irradiated superconductive body are comprised of natural uranium ranging from greater than about 150 atomic parts per million atomic parts of the body to within about ±5% of the solubility limit of the atoms in the body.

In another embodiment, the dopant atoms in the present irradiated body are comprised of $^{235}U$ atoms ranging from about 1 atomic part per million atomic parts of the body to within about ±5% of their solubility limit in the body.

In another embodiment, the dopant atoms in the irradiated body are comprised of $^{239}Pu$ atoms ranging from about 1 atomic part per million atomic parts of the body to within about ±5% of their solubility limit in the body.

The superconductive body produced by the present process is useful as a conductor for magnets, motors, generators, and power transmission lines.

The invention is further illustrated by the following examples:

EXAMPLE 1

Three powder compositions were prepared. Powder A was formulated to give $YBa_2Cu_3O_7$. Powder B was formulated to give $YBa_2Cu_3O_7$ and included $UO_2$ in an amount of 0.08% by weight of the total amount of Powder B (150 atomic ppm U). Powder C was formulated to give $YBa_2Cu_3O_7$ and included $UO_2$ in an amount of 0.2% by weight of the total amount of Powder C (380 atomic ppm U). Natural uranium dioxide was used.

The powders were prepared in the same manner. The required amounts of yttrium oxide, copper oxide, barium carbonate and uranium dioxide (none for Powder A) were ball milled in methanol with zirconia balls for four hours at room temperature. After drying for four hours under heat lamps, the powders were screened −28 mesh.

Each resulting screened powder was calcined in air at about atmospheric pressure in an alumina tray at 955° C for 24 hours. After calcining, each powder was quite friable.

Each resulting powder was milled at room temperature for two hours in heptane using a few drops of a wetting agent sold under the trademark Hamposyl-0. Each powder was then dried under nitrogen at 50° C.

X-ray diffraction analysis of each of the powders showed only the $YBa_2Cu_3O_7$ phase. No identification of the microstructural location of the uranium was possible by x-rays.

Each powder was then die pressed at 12,000 psi. The resulting compacts were sintered in an atmosphere of oxygen at about atmospheric pressure. The heating rate was ⑧° C. per hour to 955° C. where the samples were held for 8 hours. Cooling was also done in an oxygen atmosphere at about atmospheric pressure. Cooling to 400° C. took 4 hours, and the samples were held at 400° C. for 2 hours before cooling to room temperature.

Sintered body A (formed from Powder A) had a density of 5.62 g/cm$^3$.

Sintered body B (formed from Powder B) had a density of 5.45 g/cm$^3$.

Sintered body C (formed from Powder C) had a density of 5.66 g/cm$^3$.

It was determined that sintered bodies A, B, and C were superconductive and had a zero resistance transition temperature greater than 77K.

EXAMPLE 2

Bars about 3.5mm × 3.5mm × 5mm were cut from the sintered bodies produced in Example 1 for irradiation and testing.

The samples were sealed in fused quartz tubes under ½ atmosphere of oxygen, and were exposed to thermal neutrons (ratio of <1 MeV to >1 MeV, 1700:1) in Port V-11 of the Vertical Irradiation Thimble of the Brookhaven High Flux Beam Reactor. The nominal background temperature during irradiation was 60° C. the highest temperature was less than 100° C. The samples were exposed to nominal fluences of $2 \times 10^{15}$, $4 \times 10^{17}$, $1.2 \times 10^{18}$, and $5 \times 10^{18}$ thermal neutrons per cm$^2$, values later determined to be 2.09 ($\pm 1.18$)$\times 10^{15}$, 4.29 ($\pm 1.13$)$\times 10^{17}$, 1.23 ($\pm 1.05$)$\times 10^{18}$, and 3.99 ($\pm 1.13$)$\times 10^{18}$ by fission track counting in glass dosimeters as disclosed in the article by R.L. Fleischer, P.B. Price, and R.M. Walker, *Nucl. Sci. Eng.* 22, 153 (1965).

Early radioactivity was nearly equal for samples of the same size, regardless of uranium content. Later, the dominant fission decay shows the expected 2.5:1 activity ratio expected for samples with 380 and 150 ppm of uranium.

Fission fragments for $^{235}U$ have a double-peaked mass and energy distribution with an average of mass of 117 and energy of 84 MeV. The maximum internal concentration of fission events of $5.1 \times 10^{14}/cm^3$ was designed to approach (within a factor of two) that known to have a large effect on the critical current of $V_3Si$ at 1 to 3 Tesla, as disclosed in the article by C.P. Bean, R.L. Fleischer, P.S. Swartz, and H.R. Hart,Jr., *J. Appl. Phys.* 37, 2218 (1966). The concentration is given by $31 \times 10^{-8} \phi c$, where $\phi$ is the neutron fluence in cm$^{-2}$ and c, the uranium concentration, is in atom fraction/10$^6$. Given that the sum of the ranges of the two fragments from a fission event is 16 μm, the maximum internal dose may also be thought of as $4 \times 10^{11}$ fission fragments/cm$^2$

MEASUREMENT OF FLUX PINNING BY MAGNETIC HYSTERESIS

The measurements of the change in bulk flux pinning upon fission-fragment irradiation were carried out. Two potential measures of flux pinning are magnetic hysteresis and transport critical current. For polycrystalline samples the transport critical-current density is strongly dependent on the usually very poor intergrain coupling. Therefore, magnetic hysteresis was chosen for the measurement. The primary results are presented as magnetic hysteresis (emu/cm$^3$) at a field of 1 Tesla measured as a function of temperature (4 K to 77 K).

In order to measure the magnetic hysteresis loops, a Princeton Applied Research vibrating-sample magnetometer was used with a 3 Tesla electromagnet. The current in the electromagnet was programmed with a triangular wave form in order to generate the magnetization-hysteresis curve; saturation of the iron in the electromagnet resulted in a nonlinear field sweep. The field was measured by a Hall probe placed in the gap of the magnet. An ac signal proportional to the magnetization was detected by pick-up coils arranged to cancel out common-mode noise. The output of the coils was amplified by a lock-in amplifier using a 100 ms filter time constant. The outputs of the Hall probe (field) and lock-in (magnetization) were fed to an x-y recorder. Calibration of the magnetization scale was done by measuring the saturation flux from a disk of pure nickel of known weight. The sample was mounted with the long axis perpendicular to the magnetic field. Demagnetization effects are negligible (<1.5%) for the magnetizations observed at 1 Tesla.

A Janis helium cryostat, a Lake Shore temperature controller, and a carbon-glass resistance thermometer were used to control the temperature in the range 4 K to 77 K. At each temperature, after the temperature was stabilized, the sample was run through one ±2.5 Tesla field cycle before recording the magnetization-hysteresis curve. A constant sweep rate of current corresponding to a 1000 second period was used.

Magnetization-hysteresis curves at 35 K for irradiated ($4 \times 10^{18}/cm^2$) and unirradiated samples (150 atomic ppm U) are shown in FIG. 1. The arrows at 1 Tesla indicate the definition of hysteresis, ΔM, used in the following discussions; ΔM is the full difference in magnetization. The data are the average of the ΔM's obtained at +1 Tesla and at −1 Tesla. In order to determine the sensitivity of the hysteresis to the rate of field sweep, ΔM at 1 Tesla was measured for field sweep periods ranging from 20 seconds to 2000 seconds for the samples and temperature shown in Figure 1. The hysteresis at ±1 Tesla was found to decrease linearly with the logarithm of the period, with a total change of 19% for the unirradiated sample and 12% for the irradiated sample, over this 100-times range in sweep period.

In FIG. 2 are the results of hysteresis measurements displayed for samples containing 150 atomic ppm of uranium in both the unirradiated and irradiated ($1.23 \times 10^{18}/cm^2$) states and an irradiated sample with no added uranium. Strong, temperature-dependent enhancement was observed. The enhancements in flux pinning are 3.7 times at 4.5 K, 20 times at 63 K, and 8.3 times at 77 K. Note that flux pinning is decreasing rapidly at liquid nitrogen temperature.

The temperature dependence of the hysteresis indicated that not only the magnitude of the hysteresis has increased upon radiation; the pinning energy of the fission-fragment-induced pinning centers was larger than that of the pinning centers in the unirradiated samples.

Data for the other irradiations are presented in Table I for 4.5, 63, and 77 K.

TABLE I

| U-Concentration and Temp. | Magnetic Hysteresis at 1 Tesla (emu/cc) | | | |
|---|---|---|---|---|
| | Thermal Neutron Fluence | | | |
| | 0 | $4.3 \times 10^{17}$ cm² | $1.23 \times 10^{18}$/cm² | $4.0 \times 10^{18}$/cm² |
| 0 ppm | Sample A | Sample A1 | Sample A2 | |
| 4.5K | 128 | 120 | 141 | |
| 63K | 1.15 | 1.16 | 1.85 | |
| 77K | 0.39 | 0.35 | 0.46 | |
| 150 ppm | Sample B | Sample B1 | Sample B2 | Sample B3 |
| 4.5K | 122 | 143 | 450 | 303 |
| 63K | 1.52 | 6.31 | 30.5 | 20.7 |
| 77K | 0.52 | 0.90 | 4.32 | 2.56 |
| 380 ppm | Sample C | Sample C1 | Sample B2 | Sample C3 |
| 4.5K | 132 | 136 | 260 | 339 |
| 63K | 1.54 | 6.36 | 14.9 | 18.6 |
| 77K | 0.60 | 1.16 | 1.77 | 2.02 |

Table I shows that the hysteresis for the undoped samples was unchanged by a thermal neutron fluence of $4.3 \times 10^{17}$/cm² and increased by 10 to 60% for $1.2 \times 10^{18}$/cm². These increases were 3.7%, 3.1%, and 4.2% of those produced in the 150 ppm-uranium sample. The hysteresis values for the 150 ppm and 380 ppm samples were enhanced relative to both the undoped samples and the unirradiated doped samples, with a saturation of the enhancement occurring between $1.2 \times 10^{18}$ and $4 \times 10^{18}$/cm².

The enhancement was essentially the same for the two concentrations of uranium, actually larger for the 150 ppm sample at the intermediate fluence of $1.2 \times 10^{18}$/cm².

CRITICAL TEMPERATURES

Measurements of critical temperature were made for the unirradiated and irradiated ($4 \times 10^{18}$/cm²) samples using a frequency-shift ac susceptibility technique disclosed in an article by A.L. Schawlow and G.E. Devlin, *Phys. Rev.* 113, 120 (1959).

The results are shown in FIGS. 3 and 4. The irradiation lowered the onset temperatures only slightly, from 91 to 90 K and from 91.5 to 89 K for the 150 and 380 atomic ppm samples respectively. However, the 5% to 95% widths were increased upon irradiation from 4 K to 7 K and 12 K for the 150 and 380 ppm samples, respectively.

The decrease in the transition temperature of the irradiated samples also reflects the higher radiation damage in the sample of higher nominal uranium content.

MICROSCOPIC CONSIDERATIONS

Transmission electron microscopy on a 380 ppm U-containing sample exposed to thermal neutron irradiation of $2.5 \times 10^{15}$/cm² showed planar faults and localized regions of high dislocation density that are not commonly observed in the undoped sintered compacts. No evidence of fission-fragment tracks was seen.

Examination by transmission electron microscopy and electron microprobe analysis showed that the uranium was inhomogeneously distributed, with some locally concentrated in phases other than $YBa_2Cu_3O_7$, for example in inclusions of Ba—Cu—U—O or Ba—Y—U—O. There was no indication that the uranium was located preferentially on grain boundaries. The distribution of the most abundant uranium-bearing inclusions was on a fine enough scale that all of the sample could be reached by fission fragments, given the 8 μm average range of fission fragments expected for Y—Ba—Cu—O.

Light microscopy and image analysis were used to determine the size and shape distributions of the grains of the sintered compacts for the 150 and 380 ppm U-containing samples. The average ratios of the maximum diameter to the minimum diameter were found to be 1.8 and 1.9 for the 150 and 380 ppm samples respectively. The volume weighted average equivalent diameters were 11.7 and 13.9 μm, respectively. Finally, the volume fractions of pores were found to be 12 and 6%, respectively. In addition, the image analysis was used to determine the effective size and shape of the grains for use in calculating the intragranular critical-current density from the magnetic hysteresis by means of the critical-state model, as described in the next section.

INTERPRETATION OF MAGNETIC HYSTERESIS: INTRAGRANULAR CRITICAL-CURRENT DENSITIES

The critical-state model, as disclosed in the articles by C.P. Bean, *Phys. Rev. Lett.* 8, 250 (1962); C.P. Bean, *Rev. Mod. Phys.* 36, 31 (1964), together with an appropriate measurement of magnetic hysteresis, allows one to determine, for a homogeneous material, the product of the critical-current density and the dimension of the sample, $J_cD$. Unfortunately, for an inhomogeneous material such as a sintered compact the application of the critical-state model is not straightforward. At one extreme the current may flow as if the sample were homogeneous, yielding $J_{c,s}D_s$, where $D_s$ is the dimension of the sample. At the other extreme, the grains (or even smaller entities) may be essentially isolated as far as supercurrents are concerned; in this case the product obtained is $J_{c,g}D_g$, where $D_g$ is the dimension of the grain. Intermediate situations can occur, in which a portion of the super current flows throughout the sample and another portion is restricted to the grains. The critical-state model does not allow one to determine separately the applicable sizes of the regions and the appropriate $J_c$'s. There is thus an essential ambiguity in the interpretation of magnetic hysteresis by means of the critical-state model.

It is possible in principle to determine the applicable D and thus $J_c$ by a destructive experiment in which the sample is ground to powder and the magnetic hysteresis is followed as the size of the powder is decreased. The magnetic hysteresis remains unchanged as long as the dimension of the sample or powder is greater than the effective D; it decreases with size as the powder is ground into sizes smaller than D. Such experiments, as disclosed in the articles by M. Suenaga, A. Ghosh, T. Asano, R.L. Sabatini, and A.R. Moodenbaugh, *High Temperature Superconductors*, Mater.Res.Soc.Symp.-Proc., Vol. 99, edited by M.B. Brodsky, R.C. Dynes, K. Kitazawa, and H.L. Tuller (Materials Research Society, Pittsburgh, 1988), p. 247; and K. Itoh, H. Wada, T. Kuroda, Y. Kaieda, 0. Odawara, and T. Oie, *Cryogenics* 28, 575 (1988); have shown that for polycrystalline sintered compacts the effective size is not the sample size, but is closer to the (much smaller) grain size. This result is to be expected if the intergrain superconductive coupling is very weak. In the present analysis the assumption is made that, at 1 Tesla, the currents are restricted to the grains; the measured, appropriately averaged grain size is used for D and the current densities thus calculated are described as intragranular critical-current densities.

The critical-state model yields particularly simple expressions for the hysteresis for crystals of simple cross-section when certain conditions are met: The applied field is large compared with $H_{c1}$; the field variation across the sample is small enough that $J_c$ varies little across the sample; and the field has been swept through a sufficiently large excursion that critical currents have been induced in the same sense throughout the sample. These conditions are met at 1 Tesla in the present experiment. Such results are given below for two cross sections:

Circular, diameter D: $\Delta M = J_c D/30$

Rectangular, $S_2 > S_1$: $\Delta M = J_c(S_1/20)[1-(S_1 13 S_2)]$

Examination of many grains in light micrographs led to the choice of a slightly more complex cross-section, a split circle joined by a rectangular mid-section, for the analysis of the magnetic hysteresis. The image analysis of the grains in the light micrograph yielded $D_{max}$ and the area of the exposed face of each grain. These parameters were used to determine for each grain its maximum and equivalent minimum dimensions, $D_{max}$ and $D_1$. For this cross section the critical-state model yields:

$\Delta M = J_c \times (D_1/20) \times [1-(1-\pi/6)D_1/D_{max}]/[1-(1-\pi/4)D_1/D_{max}]$ The contribution of each grain to the magnetic hysteresis was calculated and summed for several hundred grains to give the factor relating the magnetic hysteresis to the critical-current density. Such analyses were performed for the 150 and 380 ppm U-containing samples, but not for the undoped sample. For convenience of discussion and presentation the factor obtained can be related to an effective diameter using the expression given above for a circular cross section. The effective diameters are 9.0 and 10.5 μm, respectively. It should be noted that these effective diameters differ from the volume-weighted values given above; the weighting differs for the magnetic analysis.

The intragranular critical-current densities calculated are shown in FIG. 2 on the right-hand scale. The discussion in the section, Measurement of Flux Pinning By Magnetic Hysteresis, applies to the critical-current densities as well, since the magnetic hysteresis and critical-current densities are related by a constant factor for each sample. Caution must be exercised in considering these current densities, for the use of the dimensions of the grains in the critical-state model is, as mentioned above, an oversimplification of a complex situation. If the dimensions of the sample had been used instead of the grain size, the critical-current densities calculated would have been smaller by a factor of 400. The important point is that, whether measured by magnetic hysteresis or by a derived critical-current density, fission-fragment irradiation of Y—Ba—Cu—O leads to a significant enhancement of flux pinning.

One special merit of fission events is a greater localization of damage into clumps of disorder - as opposed to dispersed point defects, such as produced for example by electron or gamma-ray irradiation. Because transmission electron microscopy examination found no tracks, the damage present is not from ionization, but from the 5% of the fission energy that goes directly into atomic collisions.

Even so, the expected damage is more localized than that from other forms of radiation damage.

TABLE II

| Estimated Atomic Displacements per Particle | |
|---|---|
| Particle | Approximate Number of Atomic Displacements |
| 1 MeV electron | 1 |
| 0.0025 eV neutron | 10 |
| 1 MeV neutron | 2,000 |
| 1 pair fission fragments | 200,000 |

Table II indicates the relative damage effectiveness of fission fragments under the assumption that each 50 eV expended in atomic collisions can on the average displace an atom. In addition, the fission damage is localized to within <10 μm of the fissionable atom, whereas the mean free path for a 1 MeV neutron in $YBa_2Cu_3O_7$ is 3.1 cm and its energy will be lost through a series of collisions, not in a single event.

The effects seen here are clearly caused by fission and not primarily by the neutron irradiation. Effects were present at thermal neutron doses as low as $4 \times 10^{17}/cm^2$ which included a fast component of only $2.4 \times 10^{14}/cm^2$. Thermal neutrons, via capture and gamma-ray emission can produce displacements as disclosed in the article by R.M. Walker, J. Nucl. Mat. 2, 147 (1960).

In this case, the number is uncertain, but not necessarily small, relative to fission damage, but it is more uniformly dispersed. Using Walker's first order formula and existing data as disclosed in the article by E. Troubetzkoy and H. Goldstein, Nucleonics 18 (11), 171 (1960); it was calculated that less than 5.3% of the displacements could be from thermal neutrons. If $^{235}U$ were used in place of natural uranium, fission would be enhanced relative to thermal neutron effects by 139 times.

What is claimed is:

1. A process for producing a superconductive body which comprises providing a matrix-forming powder of oxides or precursor therefor wherein the oxide composition corresponds to the matrix composition comprised of $YBa_2Cu_3O_{7-y}$ where y ranges from zero to about 1, providing an oxide additive or precursor therefor selected from the group consisting of natural uranium dioxide, uranium-235 dioxide, plutonium -239 dioxide and mixtures thereof, all of the uranium component of said additive and all of the plutonium-239 component of said additive providing dopant atoms, said natural uranium dioxide providing dopant atoms comprised of natural uranium which includes the uranium-235 isotope, forming a mixture of said matrix-forming powder and said additive or precursor therefor, heating said mixture to a reaction temperature ranging from greater than about 800° C. to below the melting point of said oxides to produce a reaction product comprised of said matrix composition and said dopant atoms wherein said dopant atoms being substituted in said matrix composition in an amount ranging to their solubility limit therein, said precursors decomposing below said reaction temperature producing said oxides, comminuting said reaction product to produce a sinterable powder, forming said sinterable powder into a compact, sintering said compact in an oxidizing atmosphere at a temperature ranging from about 900° C. to below the melting point of said sinterable powder producing a sintered polycrystalline body having an open porosity ranging from zero to about 20% by volume of said body, cooling said body in an oxidizing atmosphere at a rate which produces a superconductive body and irradiating said superconductive body with thermal neutrons causing a sufficient number of said uranium-235 and/or plutonium-239 dopant atoms to undergo fission to produce from about $2.5 \times 10^{14}$ to about $50 \times 10^{14}$ fission events per cubic centimeter of the resulting irradiated superconductive body, said uranium-235 and/or plutonium-239 dopant atoms being present in an amount sufficient to produce said fission events.

2. The process according to claim 1, wherein said additive is natural uranium dioxide and provides from about 150 to about 380 dopant atomic parts per million parts of said mixture.

3. The process according to claim 1, wherein said additive is comprised of a mixture of $^{235}UO_2$ and natural uranium dioxide wherein $^{235}U$ atoms are present in an amount ranging from about 1% by weight to about 93% by weight of said dopant atoms.

4. The process according to claim 1, wherein said additive is $^{235}UO_2$ and provides from about 0.6 to about 380 atomic $^{235}U$ parts per million atomic parts of said mixture.

5. The process according to claim 1, wherein said additive is $^{239}PuO_2$ and provides from about 0.4 to about 380 atomic $^{239}Pu$ parts per million atomic parts of said mixture.

6. The process according to claim 1, wherein from about $6 \times 10^{14}$ to about $12 \times 10^{14}$ fission events per cubic centimeter of said superconductive body are produced.

7. The process according to claim 1, wherein said additive provides about the solubility limit of said dopant atoms in said sintered body prior to said irradiation.

8. The process according to claim 1, wherein y ranges from zero to about 0.7.

9. The process according to claim 1, wherein said sintering is carried out in oxygen.

10. The process according to claim 1, wherein said sintering temperature ranges from about 900° C. to about 1000° C.

11. The process according to claim 1, wherein said cooling is carried out in oxygen.

12. A superconductive polycrystalline body comprised of the composition $YBa_2Cu_3O_{7-y}$, where y ranges from zero to about 0.3, and dopant atoms selected from the group consisting of natural uranium, $^{235}U$, $^{239}Pu$, and mixtures thereof, said natural uranium atoms ranging from a detectable amount to less than 380 atomic parts per million atomic parts of said body, said $^{235}U$ atoms ranging from a detectable amount to less than about 380 atomic parts per million atomic parts of said body, said $^{239}Pu$ atoms ranging from a detectable amount to less than about 380 atomic parts per million atomic parts of said body, said dopant atoms being substituted in said composition in an amount ranging to their solubility limit therein, said body containing from about $2.5 \times 10^{14}$ to about $50 \times 10^{14}$ fission events per cubic centimeter of said body.

13. The superconductive body according to claim 12, wherein said dopant atoms are comprised of natural uranium ranging from greater than about 150 atomic parts per million atomic parts of said body to within about ±5% of their solubility limit in the body.

14. The superconductive body according to claim 12, wherein said dopant atoms are comprised of $^{235}U$ and range from about 0.6 atomic part per million atomic parts of said body to within about ±5% of their solubility limit in the body.

15. The superconductive body according to claim 12, wherein said dopant atoms are comprised of $^{239}Pu$ and range from about 0.4 atomic part per million atomic parts of said body to within about ±5% of their solubility limit in the body.

16. The superconductive body according to claim 12, wherein said dopant atoms are comprised of a mixture of $^{235}U$ atoms and natural uranium atoms wherein said $^{235}U$ atoms range from about 1% to about 93% by weight of said dopant atoms, and wherein said dopant atoms are present to within about ±5% of their solubility limit in the body.

17. The superconductive body according to claim 12, which contains from about $6 \times 10^{14}$ to about $12 \times 10^{14}$ fission events per cubic centimeter of said body.

* * * * *